United States Patent [19]

Ishikawa

[11] Patent Number: 4,977,012

[45] Date of Patent: Dec. 11, 1990

[54] CERAMIC WIRING SUBSTRATE BLANK MATERIAL AND PROCESS FOR PRODUCTION THEREOF

[75] Inventor: Eizo Ishikawa, Ibaraki, Japan

[73] Assignee: Mitsui Kinzoku Kogyo Kabushiki Kaisha, Tokyo, Japan

[21] Appl. No.: 164,339

[22] Filed: Mar. 4, 1988

[30] Foreign Application Priority Data

Apr. 10, 1987 [JP] Japan .................................. 62-88490

[51] Int. Cl.$^5$ ........................ B32B 15/08; B32B 15/16; B32B 19/04
[52] U.S. Cl. .................................. 428/209; 428/698; 428/901; 427/96; 156/89
[58] Field of Search ........................ 428/901, 209, 698; 427/96; 156/89

[56] References Cited

U.S. PATENT DOCUMENTS

| | | | |
|---|---|---|---|
| 4,492,730 | 1/1985 | Oishi et al. ........................ | 428/901 |
| 4,781,968 | 11/1988 | Kellerman ........................ | 428/209 |

FOREIGN PATENT DOCUMENTS

| | | | |
|---|---|---|---|
| 0004370 | 1/1979 | Japan .................................. | 428/901 |
| 0149708 | 11/1979 | Japan .................................. | 428/901 |
| 61-08292 | 8/1981 | Japan .................................. | 427/96 |
| 0357510 | 9/1931 | United Kingdom ................ | 428/698 |

Primary Examiner—George F. Lesmes
Assistant Examiner—Elizabeth M. Cole
Attorney, Agent, or Firm—Stevens, Davis, Miller & Mosher

[57] ABSTRACT

A blank material for use as a ceramic wiring substrate of this invention is prepared by laminating a copper foil onto a ceramic base formed from a boron nitride sintered body or the like via a bonding layer interposed therebetween, and incoporating an inorganic filler in at least the ceramic base-containing side of the bonding layer.

A fine and high density circuit substrate can be easily formed from the ceramic wiring substrate blank material according to the present invention by a conventional etching method.

14 Claims, 1 Drawing Sheet

CERAMIC WIRING SUBSTRATE BLANK MATERIAL AND PROCESS FOR PRODUCTION THEREOF

BACKGROUND OF THE INVENTION

This invention relates to a blank material for use as ceramic wiring substrates which can be used in the production of electronic components such as printed circuit boards. The invention relates also to a process for producing this blank material.

Ceramics have excellent thermal properties, electrical properties, and other properties, and therefore the development of wiring substrates utilizing ceramic bases has been and is being promoted. Processes for producing printed circuit boards (circuit substrates) by using ceramic bases include a process wherein an adhesive such as a cold-setting adhesive or a thermosetting adhesive is coated onto the side of a ceramic base such as boron nitride or the side of a copper foil having a specific pattern, and the ceramic base and the copper foil are registered at a specific position and then are bonded together by hot pressing or the like; another process wherein a copper foil is clad on a sheet of polyimide plastic with an adhesive, the copper-clad polyimide laminate is subjected to photoetching to form a conduit pattern, an adhesive is coated onto the side of the ceramic base or the side of the polyimide laminate, and then they are laminated; a further process wherein a concavity corresponding to a pattern is formed in a ceramic base, a copper foil adjusted into the form of a specific pattern is inserted into the concavity, and then they are directly bonded; and a still further process wherein a mixture (a paste) of a finely divided metallic powder such as Ag/Pd, Ag/Pt, Au, Pt or Cu, a glass frit and a vehicle is used to carry out screen printing to form a pattern on a ceramic base, and the patterned ceramic base is fired. Besides these processes, there are other processes such as that wherein a metallic layer is formed at the surface of a sintered ceramic base by a metallizing method to prepare a material for a ceramic wiring substrate, and then a conduit pattern is formed by a conventional etching method.

Still another process wherein a ceramic base and a copper foil are affixed with an adhesive to prepare a blank material for a ceramic wiring substrate, and a circuit board is produced by a conventional etching method has been proposed. According to this process, a ceramic circuit board having a fine circuit pattern can be easily produced. Further, it is unnecessary to use complicated steps, such as registration between the ceramic base and the circuit-patterned copper foil, which were necessary in the prior art. Furthermore, the process is inexpensive because expensive materials such as polyimide laminates are not used. However, inorganic and organic adhesives for obtaining good adhesion between the ceramic base and the copper foil have not been developed, and therefore the process described above has not been used.

An object of the present invention is to provide a blank material for use as a ceramic wiring substrate wherein a copper foil is caused to be strongly bonded to a ceramic base, and wherein a high density and fine pattern can be formed.

Another object of the present invention is to provide a process whereby the blank material for use as a ceramic wiring substrate can be produced on a mass production scale.

SUMMARY OF THE INVENTION

We have examined various materials for ceramic wiring substrates and processes for production thereof. As a result, we have now found that the objects of the present invention can be achieved by forming a bonding layer containing an inorganic filler powder on a surface of a ceramic base. The present invention has been achieved on a basis of this discovery.

The essential features of a blank material for use as a ceramic wiring substrate according to the present invention are that a copper foil is laminated onto a ceramic base such as a boron nitride sintered body via an interposed bonding layer and that an inorganic filler powder is contained on at least the side of the bonding layer contacting the ceramic base.

In a preferred embodiment of the present invention, the inorganic filler powder can be at least one powder selected from boron nitride powder, antimony trioxide powder, beryllia powder, alumina powder, glass powder, carbon black, graphite, silica powder, diatomaceus earth, zirconia powder, titanium oxide powder, zeolite powder, calcium carbonate powder, magnesium carbonate powder, talc powder, barium sulfate powder, mica powder and gypsum powder.

The process for producing a material for a ceramic wiring substrate according to the present invention comprises the steps of priming at least the surface to be bonded of a sintered ceramic base with a coating composition containing an inorganic filler, and bonding a copper foil to the primed surface of the ceramic base via an interposed adhesive layer.

In one embodiment of the present invention, the step of bonding the copper foil to the primed surface of the ceramic base via the adhesive layer can be carried out by coating the copper foil with an adhesive and registering the adhesive-coated surface of the copper foil to the primed surface of the ceramic base. Alternatively, this step can be carried out by bonding the copper foil to the primed surface of the ceramic base by inserting a contact-bonding film therebetween.

If a copper foil is bonded to a ceramic base merely by means of an adhesive, a satisfactory adhesion strength cannot be obtained because the surface of porous ceramic base has many pores, and the adhesive penetrates into the pores. In the present invention, an inorganic filler powder is contained on at least the side of the bonding layer contacting the ceramic base, and therefore the inorganic filler powder fills and seals the numerous pores present at the surface of the porous ceramic base. This bonding layer serves as a sealer and serves to enhance the adhesive strength of the adhesive of the copper foil.

According to the present invention, the following effects and advantages are obtained.

(a) By the use of the blank material for ceramic wiring substrates according to the present invention, fine and high-density circuit boards can be easily produced by a conventional etching method.

(b) According to the process of the present invention, a method of bonding the ceramic base and the copper foil with an adhesive can be industrially carried out. The present process requires no complicated steps such as the registration between the ceramic base and the circuit-patterned copper foil required in the prior art. Accordingly, the blank material for ceramic wiring substrates can be produced on a mass production scale.

(c) Since the adhesion properties are improved by the incorporation of the inorganic filler, the copper foil can be strongly bonded to the ceramic base even if the adhesive layer is thin. As described above, the mass productivity is remarkably improved, and therefore the blank material for ceramic wiring substrates and further circuit boards can be produced at a low cost.

DETAILED DESCRIPTION OF THE INVENTION

Figure 1:
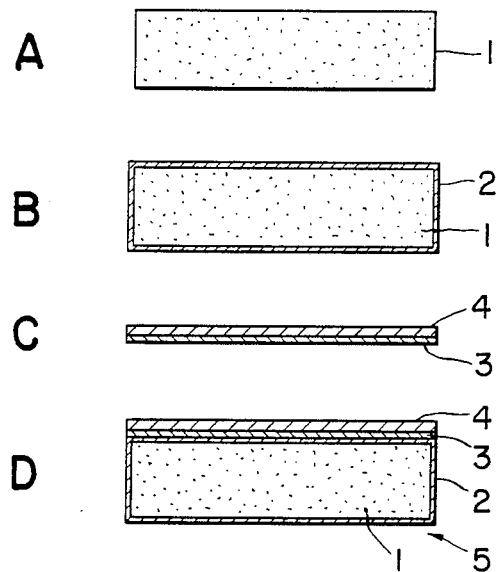
FIGS. 1A through 1D are sectional views of a substrate illustrating steps of one embodiment of the process according to the present invention.

In one example of a process for producing a ceramic wiring substrate blank material according to the present invention, at least the surface to be bonded of a sintered ceramic base is first primed with a coating composition containing an inorganic filler powder.

Examples of the materials from which the ceramic bases used in the present invention are produced include oxide ceramics such as alumina, beryllia, magnesia, zirconia, yttria, thoria, steatite, forsterite, zircon, cordierite, mullite, and titania; carbide ceramics such as silicon carbide and boron carbide; nitrides such as boron nitride, silicon nitride, aluminum nitride and titanium nitride; silioides such as molybdenum disilicide; and borides such as titanium boride. More preferred ceramics are hexagonal boron nitride and the like. This ceramic base is formed and sintered by specific methods. It is preferred that the shape and dimensions of the ceramic base be suitably varied according to its purpose.

The priming according to the present invention is carried out by coating at least the surface to be bonded of a ceramic base with a coating composition. The coating composition which will form a primer layer is one which improves the adhesion properties of the surface to be bonded of the ceramic base. Examples of such coating compositions include those comprising a thermosetting resin and an inorganic filler. Examples of such inorganic fillers include at least one powder selected from boron nitride powder, antimony trioxide powder, beryllia powder, alumina powder, glass powder, carbon black, graphite, silica powder, diatomaceus earth, zirconia powder, titanium oxide powder, zeolite powder, calcium carbonate powder, magnesium carbonate powder, talc powder, barium sulfate powder, mica powder and gypsum powder. Of these, examples of preferred fillers include hexagonal boron nitride powder, antimony trioxide powder, beryllia powder, alumina powder, and silica powder. While the selection of the inorganic filler is optional in the present invention, it is desirable that the selection be carried out so that the primer layer is composed of materials similar to those of the ceramic base. The inorganic filler used in the present invention has an average particle size of, for example, from 100 to 0.05 micrometer, preferably from 30 to 0.3 micrometer, and more preferably from 3 to 0.3 micrometer. It is desirable that the grain size be changed in accordance with the types of the ceramic bases. This is because the porous surface of the ceramic base is effectively sealed.

Priming with the coating composition can be carried out by various methods. Examples of such methods include a method wherein a ceramic base is immersed in a bath of the coating composition to coat it with the coating composition; a method of spraying the coating composition onto the ceramic base; and a method of applying the coating composition to the ceramic base. In this treatment, it is not necessary to coat the whole surface of the ceramic base with the coating composition, and at least the surface to be bonded is coated with the coating composition. The thickness of the primer layer formed by coating the coating composition can be suitably varied according to the desired performance, and is, for example, from 5 to 10 micrometers. After coating of the coating composition, the coated layer is dried suitably to form a primer layer.

In a subsequent step of the process of the present invention, a copper foil is bonded to the primed surface of the ceramic base via an interposed adhesive layer. There are various bonding methods. Examples of such bonding methods include a method wherein a thermosetting adhesive is applied to the surface of the copper foil, the adhesive-coated surface of the copper foil and the primed surface of the ceramic base are registered, and then the laminate is hot pressed; another method wherein a thermosetting adhesive is applied to the primed surface of a ceramic base, the adhesive-coated surface of the ceramic base and the surface of the copper foil are registered, and then the laminate is hot pressed; and a further method wherein a thermosetting adhesive film is sandwiched between the primed surface of the ceramic base and the copper foil, and then the laminate is hot pressed.

Examples of such adhesives used in the bonding step include thermosetting adhesives such as epoxy resin adhesives, unsaturated polyester resin adhesives, phenolic resin adhesives, urethane resin adhesives and amino resin adhesives; instantaneous adhesives such as cyanoacrylate adhesives; and rubbers adhesives. The adhesives can be suitably selected according to the types of the ceramic base and the primer and the like. The inorganic filler powder described above can be incorporated in this adhesive. In the present invention, preferred adhesives have good adhesiveness relative to the primer layer or the ceramic base and the copper foil.

The copper foil used in the present invention is composed of copper, or alloys or composite materials thereof. The thickness of the copper foil can be suitably selected according to the use. The copper foil may be a copper plate.

Referring to the drawings, one embodiment of the process of the present invention will be described.

First, a ceramic base 1 is prepared (FIG. 1A), and the whole surface of the ceramic base 1 is coated with a coating composition to form a primer layer 2. (FIG. 1B) A copper foil 4 is then coated with an adhesive to form an adhesive layer 3, which is dried. (FIG. 1C). The copper foil 4 having the adhesive layer formed thereon is registered relative to the ceramic base 1 having the primer layer 2 formed thereon, and thereafter the two are bonded under specific conditions by a hot press or the like. (FIG. 1D) As shown in FIG. 1D, the resulting material for the ceramic wiring substrate obtained in this example is one wherein the primer layer 2, adhesive layer 3 and copper foil 4 are laminated onto the ceramic base 1 in this order.

Figure 2:
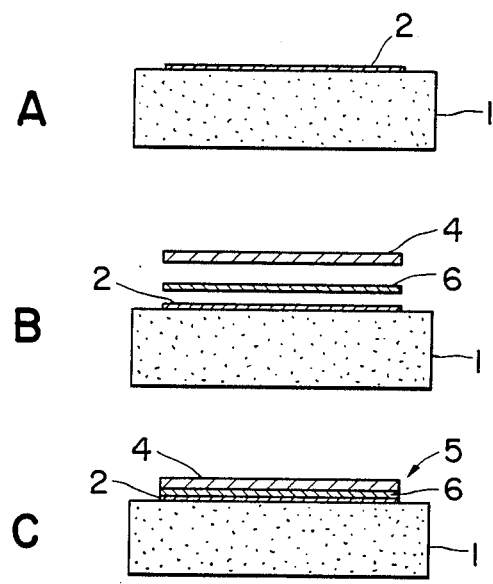
FIGS. 2A, 2B, and 2C are sectional views showing steps of another embodiment of the process according to the present invention.

The blank material for ceramic wiring substrates and the process for producing the same according to the present invention are not limited to the example described above. Various changes can be made within the scope of the present invention. For example, as shown in FIG. 2, a blank material 5 for a ceramic wiring substrate may be produced by forming a primer layer 2 only on the surface to be bonded of a ceramic base 1, sandwiching a hot press film 6 between a copper foil 4 and the primer layer 2, and hot pressing the thus stacked assembly. (FIGS. 2A, 2B, and 2C)

An adhesive containing an inorganic filler powder may also be applied onto a copper foil, and then this laminate may be bonded directly to the surface of a ceramic base.

The blank material for ceramic wiring substrates according to the present invention can be used for various uses. For example, a circuit board can be produced by forming an etching-resist film on the specific circuit portion of the surface of a copper foil, etching and removing the copper other than the specific circuit portion, and thereafter peeling off the etching-resist film. Similarly, a great variety of electronic components can be produced.

EXAMPLES

While the present invention is illustrated more fully by the following examples, it is not limited thereto.

EXAMPLE 1

A 2 mm thick ceramic base composed of a sintered hexagonal boron nitride stock was prepared. The ceramic base was immersed in a coating composition obtained by adding 8% by weight of hexagonal boron nitride powder having an average grain size of 1 $\mu$m to a thermosetting epoxy adhesive (AH 359×3 available from Mitsui Petrochemical Industries, Ltd., Japan) and coated with the coating composition. The treated ceramic base was dried for 60 minutes at a temperature of 120° C. to cause the coating composition to adhere and solidify to form a 5 $\mu$m thick primer layer. A 35 $\mu$m thick electrolytic copper foil was coated with a thermosetting epoxy adhesive (AH 359×3 available from Mitsui Petrochemical Industries, Ltd., Japan) by means of an about 30 $\mu$m wire bar. The adhesive layer of the copper foil was then placed in contact with the surface of the primer layer of the ceramic base, and the resulting laminate was hot pressed for 60 minutes at a temperature of 170° C. under a pressure of 20 kg/cm$^2$ by means of a hot press.

The thickness of the adhesive layer of the resulting material for the ceramic wiring substrate was 20 $\mu$m. The peel strength between the ceramic base and the copper foil was 1.5 kg/cm under the following conditions: peel angle of 90° and copper width of 1 cm. The peel strength after 20 seconds at a solder heat-resistant temperature of 260° C. was maintained at 1.5 kg/cm.

A circuit board was then formed from the blank material for ceramic wiring substrates according to this example. More specifically, the surface of the copper foil was coated with a positive liquid resist (PMER-PR30S available from Tokyo Ohka Kogyo Co., Ltd., Japan) to a thickness of 5 $\mu$m, and the coated copper foil was dried and baked for 25 minutes at a temperature of 90° C. The resist described above was exposed to light via a specific exposure mask and thereafter developed for 60 seconds with a developer for the liquid resist described above at a temperature of 25° C. Etching was then carried out for 90 seconds with a cupric chloride solution at a temperature of 35° C., and thereafter the resist was peeled off with a 5% caustic soda solution to obtain a circuit board having a specific circuit pattern.

EXAMPLE 2

A blank material for ceramic wiring substrates was prepared, and the peel strength between the ceramic base and the copper foil was measured as described in Example 1 except that 8% by weight of hexagonal boron nitride powder having an average grain size of 1 $\mu$m was also added to the adhesive. Its peel strength was 2.0 kg/cm under the conditions of a peel angle of 90° and a copper width of 1 cm.

EXAMPLES 3 THROUGH 10

Blank materials for ceramic wiring substrates having the layer structures as shown in Table 1 were prepared, and their peel strengths were measured as described in Example 1. The results are shown in Table 1.

COMPARATIVE EXAMPLE 1

A blank material for ceramic wiring substrates was prepared, and the peel strength between the ceramic base and the copper foil was measured as described in Example 1 except that no boron nitride powder was added to the primer layer. The results are shown in Table 1.

EXAMPLE 11 AND 12

Blank materials for ceramic wiring substrates were prepared, and their peel strengths were measured as described in Example 1 except that no primer layer was applied and an inorganic filler powder was added to the adhesive layer. The results are shown in Table 1.

COMPARATIVE EXAMPLE 2

A blank material for ceramic wiring substrates was prepared, and its peel strength was measured as described in Example 1 except that no inorganic filler powder was added to the adhesive layer. The results are shown in Table 1.

TABLE 1

| Example No. | Layer Structure |
|---|---|
| 1 | Copper foil/epoxy adhesive/epoxy adhesive + 8% BN powder/BN base; Peel strength: 1.5 kg/cm |
| 2 | Copper foil/epoxy adesive + 8% Bn powder/epoxy adhesive + 8% BN powder/BN base; Peel strength: 2.0 kg/cm |
| 3 | Copper foil/expoxy adhesive/epoxy adhesive + 9% antimony trioxide powder/BN base; Peel strength: 1.0 kg/cm |
| 4 | Copper foil/epoxy resin/epoxy resin + 4% BN powder/BN base; Peel strength 0.8 kg/cm |
| 5 | Copper foil/epoxy adhesive/epoxy adhesive + 8% BN powder/BN base; Peel strength 2.0 kg/cm |
| 6 | Copper foil/epoxy adhesive/epoxy adhesive + 9% antimony trioxide powder + 8% BN powder/BN base; Peel strength: 2.0 kg/cm |
| 7 | Copper foil/epoxy adhesive + 16% BN powder/epoxy adhesive + 16% BN powder/BN base; Peel strength: 1.0 − 0.8 kg/cm |
| 8 | Copper foil/epoxy adhesive/epoxy adhesive + 4% alumina powder/BN base; Peel strength: 1.0 − 1.3 kg/cm |

TABLE 1-continued

| Example No. | Layer Structure |
|---|---|
| 9 | Copper foil/epoxy adhesive/epoxy adhesive + 8% alumina powder/BN base; Peel strength: 1.0 — 1.1 kg/cm |
| 10 | Copper foil/epoxy adhesive/epoxy adhesive + 16% alumina powder/BN base; Peel strength: 0.8 — 1.3 kg/cm |
| Comparative Example 1 | Copper foil/epoxy adhesive/epoxy adhesive/BN base; Peel strength: 0.5 kg/cm |
| 11 | Copper foil/epoxy adhesive + 8% BN powder/ — /BN base; Peel strength: 1.5 kg/cm |
| 12 | Copper foil/epoxy adhesive + 9% antimony trioxide powder + 8% BN powder/ — /BN base; Peel strength: 1.8 kg/cm |
| Comparative Example 2 | Copper foil/expoxy adhesive/ — /BN base; Peel strength: 0.4 kg/cm |

What is claimed is:

1. A ceramic wiring substrate blank material having an exposed surface conductor and comprising, in laminated state, a ceramic base, a copper foil providing said exposed surface conductor, and a bonding layer interposed between said base and said foil and containing on at least the side thereof contacting said base an inorganic filler for filling the pores of said ceramic base and providing enhanced adhesion between said copper foil and ceramic base, wherein the bonding layer comprises a primer layer and an adhesive layer respectively contacting the ceramic base and the copper foil and wherein an inorganic filler is incorporated in the primer layer.

2. The blank material according to claim 1, wherein the ceramic base is composed of a boron nitride sintered body.

3. The blank material according to claim 1, wherein the inorganic filler is at least one powder selected from boron nitride powder, beryllia powder, antimony trioxide powder, alumina powder, glass powder, carbon black, graphite powder, silica powder, diatomaceus earth powder, zirconia powder, titanium oxide powder, zeolite powder, calcium carbonate powder, magnesium carbonate powder, talc powder, barium sulfate powder, mica powder and gypsum powder.

4. The blank material according to claim 1, wherein the average particle size of the inorganic filler powder is from 0.05 to 3 micrometers.

5. The blank material according to claim 1, wherein the content of the inorganic filler powder is from 3% to 20% by weight.

6. A process for producing a ceramic wiring substrate blank material having an exposed surface conductor which can be processed into a conductive pattern, said process comprising the steps of priming at least a surface of a sintered ceramic base to be bonded with a primer coating composition containing an inorganic filler, and bonding a copper foil providing said exposed surface conductor to the primed surface of the ceramic base via an adhesive layer interposed therebetween, said inorganic filler filling the pores of said sintered ceramic base and providing enhanced adhesion between said copper foil and sintered ceramic base.

7. The process for producing the blank material according to claim 6, wherein the ceramic base comprises a boron nitride sintered body.

8. The process for producing the blank material according to claim 6, wherein the step of bonding the copper foil to the primed surface of the ceramic base via the adhesive layer interposed therebetween is carried out by coating a surface of the copper foil with an adhesive and registering the adhesive-coated surface of the copper foil to the primed surface of the ceramic base.

9. The process for producing the blank material according to claim 6, wherein the step of bonding the copper foil to the primed surface of the ceramic base via the adhesive layer is carried out by bonding the copper foil to the primed surface of the ceramic base by inserting a contact-bonding film therebetween.

10. The process for producing the blank material according to claim 6, wherein the inorganic filler of the coating composition is at least one powder selected from boron nitride powder, beryllia powder, antimony trioxide powder, alumina powder, glass powder, carbon black powder, graphite powder, silica powder, diatomaceus earth powder, zirconia powder, titanium oxide powder, zeolite powder, calcium carbonate powder, magnesium carbonate powder, talc powder, barium sulfate powder, mica powder and gypsum powder.

11. The process for producing the blank material according to claim 10, wherein the average particle size of the inorganic filler powder of the coating composition is from 0.05 to 3 micrometers.

12. The process for producing the blank material according to claim 10, wherein the content of the inorganic filler powder of the coating composition is from 3% to 20% by weight.

13. The process for producing the blank material according to claim 6, wherein the adhesive comprises a thermosetting resin.

14. The process for producing the blank material according to claim 13, wherein the step of bonding the copper foil to the primed surface of the ceramic base is carried out by hot pressing.

* * * * *